(12) United States Patent
Radic et al.

(10) Patent No.: US 7,838,389 B2
(45) Date of Patent: Nov. 23, 2010

(54) ENCLOSED VOID CAVITY FOR LOW DIELECTRIC CONSTANT INSULATOR

(75) Inventors: Ljubo Radic, Chandler, AZ (US); Edouard D. deFresart, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 211 days.

(21) Appl. No.: 12/129,846

(22) Filed: May 30, 2008

(65) Prior Publication Data

US 2009/0294843 A1 Dec. 3, 2009

(51) Int. Cl.
*H01L 29/72* (2006.01)
(52) U.S. Cl. .................. 438/424; 438/270; 438/296; 438/435
(58) Field of Classification Search ........... 438/270, 438/296, 424, 435
See application file for complete search history.

(56) References Cited

U.S. PATENT DOCUMENTS

| | | | |
|---|---|---|---|
| 6,013,933 | A | 1/2000 | Foerstner et al. |
| 7,005,371 | B2 | 2/2006 | Chinthakindi et al. |
| 7,023,063 | B2 | 4/2006 | Gabric et al. |
| 7,087,438 | B2 | 8/2006 | Kasko et al. |
| 7,098,476 | B2 | 8/2006 | Babich et al. |
| 7,230,296 | B2 | 6/2007 | Gluschenkov et al. |
| 7,238,568 | B2 | 7/2007 | Williams et al. |
| 7,253,479 | B2 | 8/2007 | Sugaya |
| 7,256,127 | B2 | 8/2007 | Gallagher et al. |
| 7,264,986 | B2 | 9/2007 | Gogoi |
| 7,265,064 | B2 | 9/2007 | Morisaki et al. |

(Continued)

FOREIGN PATENT DOCUMENTS

| | | |
|---|---|---|
| EP | 1742260 A2 | 1/2007 |
| EP | 1744359 A1 | 1/2007 |

OTHER PUBLICATIONS

Follstaedt, D.M., et al., Cavity and Impurity Gettering in He-Implanted Si, Sandia National Laboratories, Feb. 8, 1995.

*Primary Examiner*—Edward Wojciechowicz
(74) *Attorney, Agent, or Firm*—Ingrassia, Fisher & Lorenz, P.C.

(57) ABSTRACT

Field effect devices and ICs (80, 82, 84) with very low gate-drain capacitance Cgd are provided by forming a substantially empty void (70, 100) between the gate (60') and the drain (27) regions. For vertical FETS a cavity (70, 100) is etched in the semiconductor (SC) (40) and provided with a gate dielectric liner (54, 92). A poly-SC gate (60') deposited in the cavity (50) has a central fissure (empty pipe) (63) extending through to the underlying SC (40). This fissure (63) is used to etch the void (70, 100) in the SC (40) beneath the poly-gate (60'). The fissure (63) is then closed by a dielectric plug (74, 84, 102) formed by deposition or oxidation without significantly filling the etched void (70, 100). Conventional process steps are used to provide the source (24) and body regions (25) around the cavity (50) containing the gate (60'), and to provide a drift space (26) and drain region (27) below the body region (25). The etched void (70, 100) between the gate (60') and drain (27) provides lower Cgd and Ron*Qg than can be achieved using low k dielectrics.

17 Claims, 12 Drawing Sheets

U.S. PATENT DOCUMENTS

| | | |
|---|---|---|
| 7,351,669 B2 | 4/2008 | MacNeil |
| 7,414,286 B2 | 8/2008 | Hirler et al. |
| 2006/0084262 A1 | 4/2006 | Qin |
| 2006/0091453 A1* | 5/2006 | Matsuda et al. ............. 257/330 |
| 2007/0114600 A1 | 5/2007 | Hirler et al. |
| 2007/0197043 A1 | 8/2007 | Van Noort et al. |

* cited by examiner

ENCLOSED VOID CAVITY FOR LOW DIELECTRIC CONSTANT INSULATOR

FIELD OF THE INVENTION

The present invention generally relates to semiconductor (SC) devices and integrated circuits (ICs) and, more particularly, structures and methods for forming void cavities within SC devices and ICs as reduced dielectric constant insulating regions.

BACKGROUND OF THE INVENTION

In many semiconductor (SC) devices and integrated circuits (ICs), capacitive coupling from the control element or electrode to the output region of the device limits the device performance. Well known examples are trench type field effect transistors (Trench-FETS), V-type metal-oxide-semiconductor (VMOS) transistors, T-type metal-oxide-semiconductor (TMOS) transistors, lateral diffused metal-oxide-semiconductor (LDMOS) or other metal-oxide-semiconductor field effect transistors (MOSFETs) implemented in power IC platforms, where the capacitance Cgd between the control gate and the drain region of the device is larger than desired. This excess gate-drain capacitance Cgd can significantly degrade overall device and IC performance. It will be understood by those of skill in the art that the designations "metal-oxide-semicondutor" and the abbreviation "MOS" and "MOSFET" as used herein include devices utilizing any kind of dielectric not just oxides and any kind of conductor not just metals.

FIG. 1 is a simplified schematic cross-sectional view of a generalized vertical power semiconductor device 20 according to the prior art, illustrating how the gate-drain capacitance Cgd can arise. For convenience of explanation, it is assumed in connection with device 20 and other devices illustrated herein that such devices are N-channel power devices formed in silicon semiconductor (SC) material, but this is not intended to be limiting and persons of skill in the art will understand that other semiconductor (SC) materials may be used, that other substrates may be used (e.g., SC on insulator), and that P-channel devices and other kinds of both power and small signal devices can be formed by appropriate interchange or rearrangement of the various doped regions. Device 20 has semiconductor substrate 21, with upper surface 22 and lower surface 23, in which are formed source region 24 of a first conductivity type (e.g., N+), body region 25 of a second, opposite conductivity type (e.g., P BODY), drift space or region 26 of the first conductivity type (e.g., N DRIFT SPACE) and drain region 27 of the first conductivity type (e.g., N+DRAIN). Cavity 28 is formed in SC substrate 21 extending from upper surface 22 through source region 24 and body region 25 to or into drift region or space 26. Gate dielectric 29 separates P BODY region 25 (and also N DRIFT SPACE 26) from gate 30 located within cavity 28. Gate 30 is conveniently of polycrystalline semiconductor (e.g., POLY GATE) of, for example silicon, but any conductor may be used. Gate dielectric 29 is conveniently of silicon oxide although other insulating materials may also be used. Gate contact 32 with terminal 33 is formed in ohmic contact with POLY GATE 30. Source contact 34 with terminal 35 is formed in ohmic contact with source region 24. Dielectric lateral spacer 36 is conveniently provided to separate gate and source contacts 32, 34. Drain contact 38 with terminal 39 is provided in ohmic contact with drain region 27. When device 20 is appropriately biased, electron current Isd flows from source region 24 to drain region 27, under the control of gate 30. Gate-drain capacitance 37, abbreviated as Cgd, couples gate 30 and drain region 27 across gate dielectric 29 through N DRIFT space or region 26.

Various attempts have been made in the prior art to reduce Cgd by, for example, making cavity 28 "V" shaped and/or by providing region 39 of lower dielectric constant material between bottom 31 of gate 30 and N DRIFT space or region 26 and drain 27. However, none of these and other approaches have been successful in minimizing Cgd since, for example, the lower dielectric constant materials that might be used in region 39 still have dielectric constants k significantly larger than vacuum or air. Accordingly, there is an ongoing need to provide improved fabrication methods and structures for semiconductor devices and ICs capable of achieving lower Cgd than has hitherto been possible, and that are compatible with established semiconductor device and IC fabrication methods and materials.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

Figure 1:
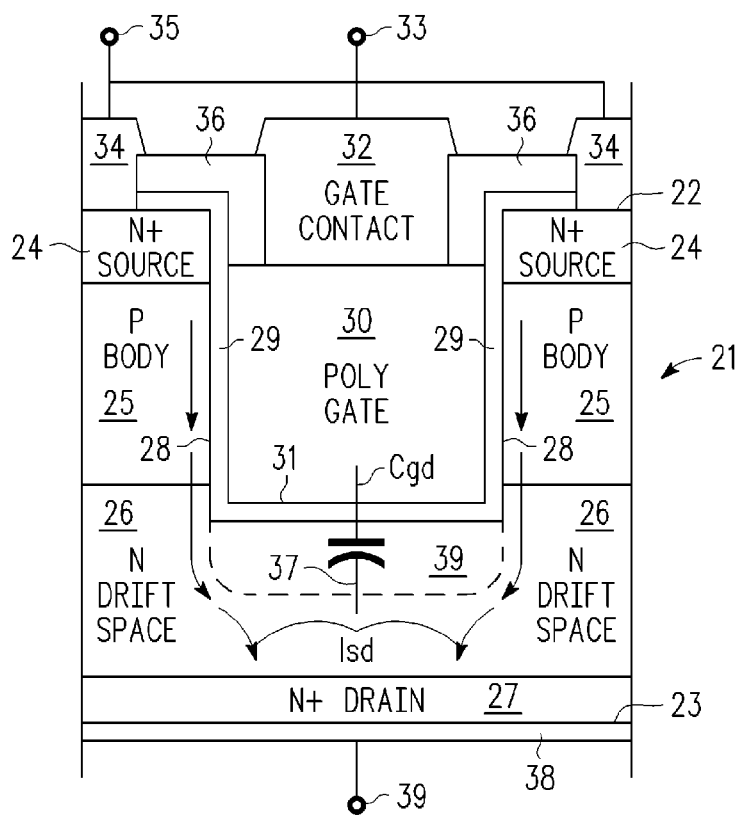
FIG. 1 is a simplified schematic cross-sectional view of generalized vertical power device 20 according to the prior art.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences or orientations other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements or steps not expressly listed or inherent to such process, method, article, or apparatus. The term "coupled," as used herein, is defined as directly or indirectly connected in an electrical or non-electrical manner. For convenience of explanation and not intended to be limiting, the semiconductor devices and methods of fabrication are described herein for silicon semiconductors, but persons of skill in the art will understand that other semiconductor materials can also be used. The term "poly-semiconductor" standing for a polycrystalline semiconductor or other conductive material whether semiconductor or not, is abbreviated as "poly-SC". Similarly, polycrystalline silicon is abbreviated as Poly-Si.

The various embodiments of the invention described here are illustrated by semiconductor devices and structures of particular conductivity type having various P and N doped regions appropriate for that conductivity type device or structure. But this is merely for convenience of explanation and not intended to be limiting. Persons of skill in the art will understand that devices or structures of opposite conductivity type may be provided by interchanging conductivity types so that a P-type region becomes an N-type region and vice versa. Alternatively, the particular regions illustrated in what follows may be more generally referred to as of a "first conductivity type" and of a "second opposite conductivity type, where the first conductivity type may be either N or P type and the second opposite conductivity type is then either P or N type, and so forth. Further, for convenience of explanation and not intended to be limiting, various embodiments of the present invention are described herein for silicon semiconductors, but persons of skill in the art will understand the invention is not limited to silicon but applies to a wide variety of semiconductor materials. Non-limiting examples are other type IV semiconductor materials, as well as type III-V and II-VI semiconductor materials and organic semiconductors and combinations thereof, whether in bulk single crystal or polycrystalline form or in thin film form or semiconductor-on-insulator form or combinations thereof.

FIGS. 2-9 are simplified schematic cross-sectional views of a generalized vertical semiconductor device, analogous to device 20 of FIG. 1, but according to embodiments of the present invention, at various stages of manufacture. Referring now to manufacturing stage 201 of FIG. 2, semiconductor body or substrate 40 (e.g., silicon) having upper surface 42 and lower surface 43 is provided. Covering upper surface 42 is dielectric layer 44 (e.g., of silicon oxide) of thickness 45, above which is provided etch mask 46 of thickness 47 (e.g., of silicon nitride). Thickness 45 is usefully in the range of about 0 to 100 micrometers, more conveniently in the range of about 0.0015 to 1 micrometers and preferably about 0.01 to 0.1 micrometers, but thicker and thinner layers can also be used. In some embodiments dielectric layer 44 may be omitted. The purpose of layer 44 is to protect and passivate surface 42. Thickness 47 is usefully in the range of about 0.01 to 5 micrometers, more conveniently in the range of about 0.01 to 1 micrometers and preferably about 0.1 to 0.5 micrometers, but thicker and thinner layers can also be used. Etch mask 46 has opening 48 therein. The purpose of etch mask 46 is to protect layer 44 and surface 42 during etching of cavity 50 into semiconductor substrate 40. Therefore, etch mask 46 is desirably substantially impervious to the reagents used to etch cavity 50 in semiconductor substrate 40. Anisotropic etching is used in conjunction with etch mask 46 to etch cavity 50, for example, of diameter or lateral extent 51 to depth 52. For many devices, diameter 51 is usefully in the range of about 0.05 to 20 micrometers, more conveniently in the range of about 0.05 to 5 micrometers and preferably about 0.1 to 1 micrometers, but wider and narrower cavities can also be formed. Depth 52 is usefully in the range of about 0.1 to 10 micrometers, more conveniently in the range of about 0.3 to 5 micrometers and preferably about 0.5 to 2 micrometers, but deeper or shallower cavities can also be formed. Stated another way, it is often the case that depth 52 is usefully in the range of about 0.1 to 100 times diameter 51, more conveniently in the range of about 0.5 to 10 times diameter 51 and preferably about 1 to 5 times diameter 51. Structure 301 results.

Figure 3:
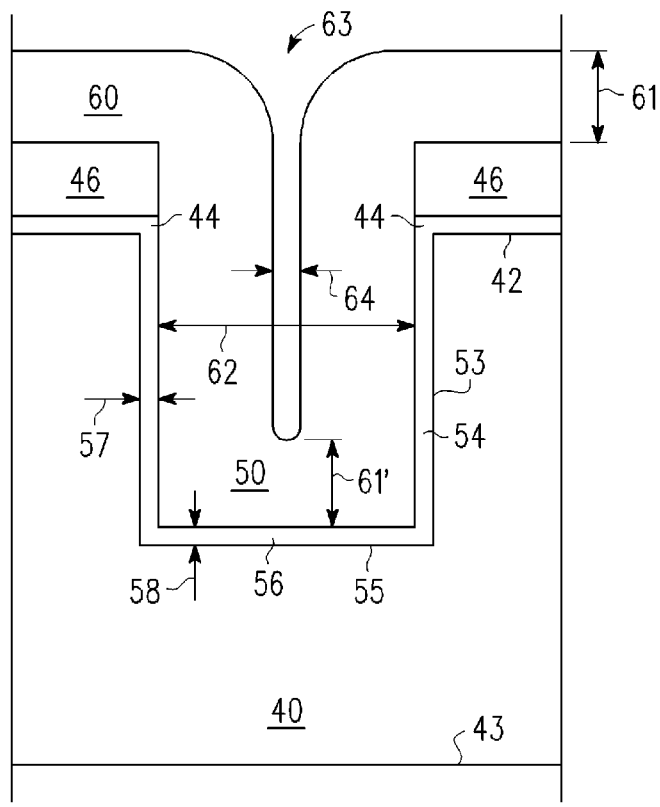

Referring now to manufacturing stage 202 of FIG. 3, sidewall 53 and bottom or floor 55 of cavity 50 of structure 301 are desirably oxidized or otherwise coated with dielectric 54 (on sidewall 53) and 56 (on bottom or floor 55). Where SC body 40 is silicon, dielectric 54, 56 is conveniently of silicon oxide, produced for example, by thermal oxidation of SC body 40, however other dielectrics and other preparation methods may also be used. Thicknesses 57, 58 are usefully in the range of about 0.1 to 1000 nanometers, more conveniently in the range of about 1 to 100 nanometers and preferably about 10 to 50 nanometers, but thicker and thinner layers can also be formed. As is explained later, sidewall dielectric layer 54 conveniently provides the gate dielectric of the finished device. Conductive layer 60 is then formed by blanket conformal deposition above etch mask 46 and in cavity 50 to thickness 61 that is desirably less than half of width 62 between dielectric layer 54 on sides 53 of cavity 50, so as to leave central fissure or empty pipe 63 of width 64. Fissure or pipe 63 will extend to distance 61' from dielectric layer 56 on bottom 55 of cavity 50. Distance 61' is typically about equal to thickness 61. Width 64 is usefully in the range of about 0.001 to 1 micrometers, more conveniently in the range of about 0.001 to 0.5 micrometers and preferably about 0.01 to 0.2 micrometers. Stated another way, width 64 is usefully about 2 to 45 percent of width 62, more conveniently about 5 to 20 percent of width 62 and preferably about 5 to 10 percent of width 62. Structure 302 results.

Figure 4:
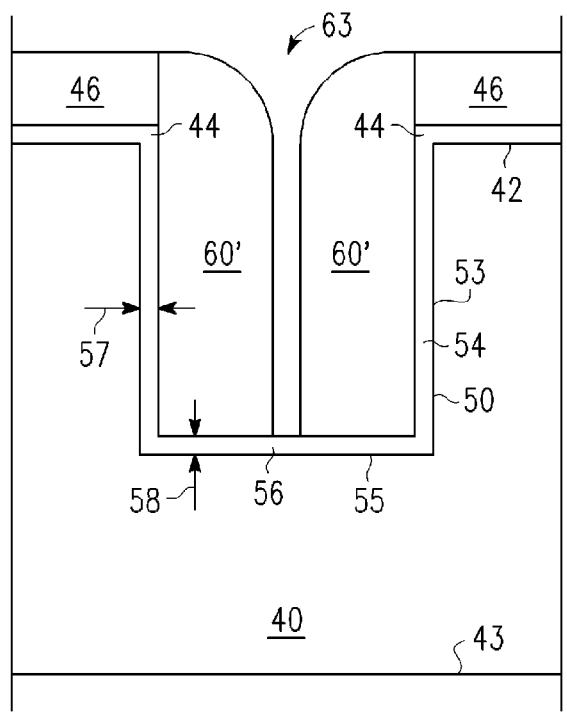
Figure 5:
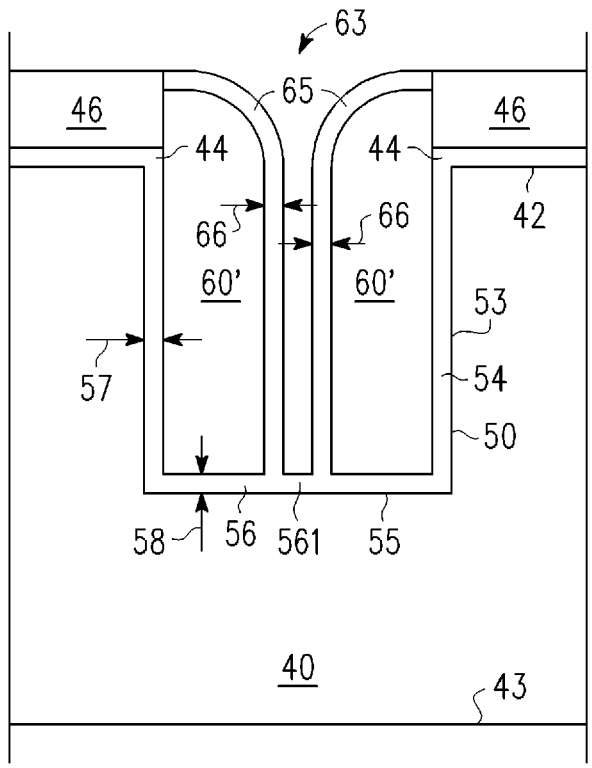

Referring now to manufacturing stage 203 of FIG. 4, structure 302 is subjected to anisotropic etch so as to remove at least distance or thickness 61' of conductor 60, so that fissure or pipe 63 extends to dielectric layer 56 on bottom 55 of cavity 50. Structure 303 results. In manufacturing stage 204 of FIG. 5, remaining portion 60' of layer 60 of structure 303 is covered with layer 65 of thickness 66. Where portion 60' is of poly-SC as for example, poly-silicon, thermal oxidation is a convenient means of providing layer 65 of silicon oxide, however, other formation methods may also be used in other embodiments and for other dielectrics. Thickness 66 is generally similar to thicknesses 57, 58 of dielectric layer 54, 56, and is depicted in FIG. 5 as forming a continuous, e.g., silicon oxide, region. Structure 304 results.

Figure 6:
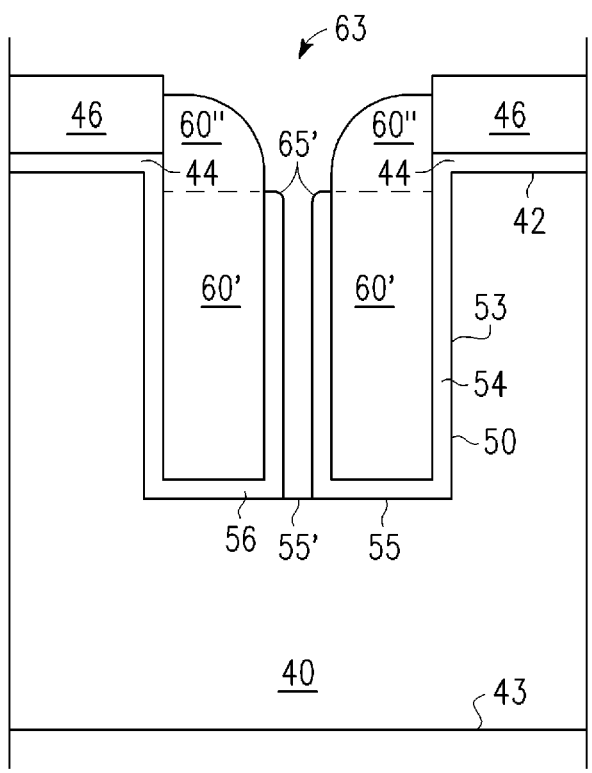
Figure 7:
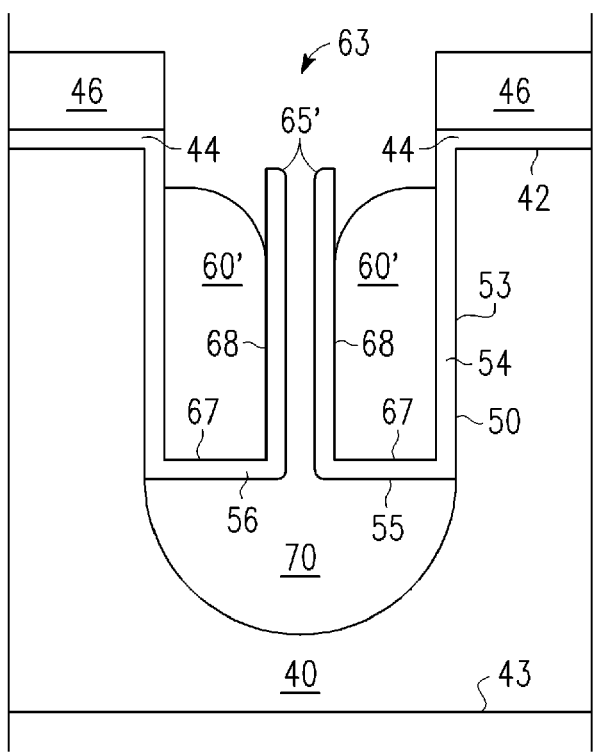

Referring now to manufacturing stage 205 of FIG. 6, anisotropic etching (e.g., sputtering or the like) is used to remove portion 561 of dielectric layer 56 at the bottom of fissure or pipe 63 so that portion 55' of bottom 55 of cavity 50 is exposed. Portion 65' of dielectric (e.g., silicon oxide) layer 65 is left on the sidewalls of fissure or pipe 63. Structure 305 results. In manufacturing stage 206 of FIG. 7, structure 305 is subjected, for example, to an isotropic etch of conductor semiconductor body 40. It is assumed here by way of example, that body 40 is silicon and that conductor 60 is poly-silicon, so that both body 40 underlying bottom 55 of cavity 50 and upper portion 60" of conductor 60' in cavity 50 (see FIGS. 6-7) are etched at the same time. The result of such etching is to produce cavity 70 underlying what was bottom 55 of cavity 50. Underside 67 of conductor 60' on dielectric layer 56 and sidewall 68 of conductor 60 on dielectric layer 65' adjacent fissure or pipe 63 are protected by dielectric layers 56, 65' (e.g., silicon oxide) that are not attacked by the etchant for SC body 40 and conductor 60'. Structure 306 results. In the example of FIG. 7, etching of SC substrate 40 through fissure 63 is preferably carried on until void cavity 70 has about the same diameter as initial cavity 50, but this is not intended to be limiting and void cavity 70 may be made laterally larger or smaller than cavity 50 by adjusting the etching time. While isotropic etching is convenient for forming void cavity 70, anisotropic etching before or after isotropic etching may also be used to selectively deepen cavity 70. Anisotropic and isotropic etching can be used in sequence to vary the cavity 70 depth while keeping its width substantially constant. This variation allows semi-independent control of width and depth, within certain reasonable limits.

Figure 8:
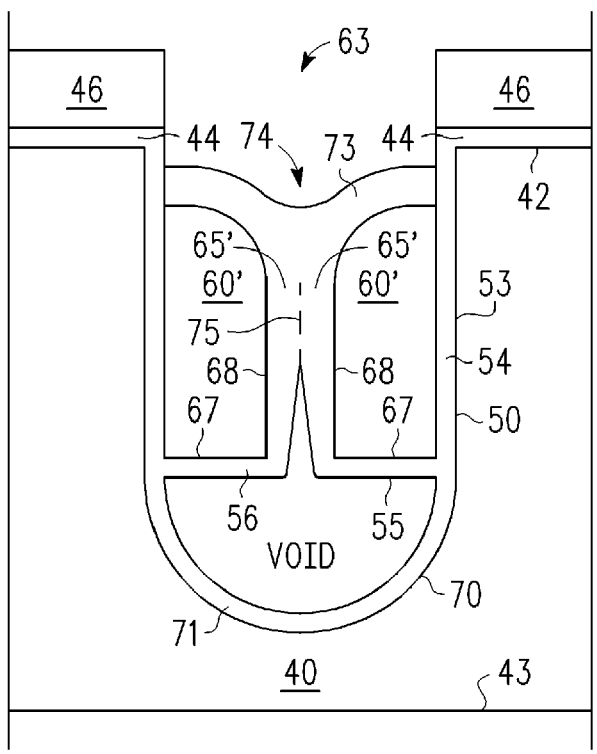

Referring now to manufacturing stage 207 of FIG. 8, structure 306 of FIG. 7 is subjected to, for example, thermal oxidation, to close fissure or pipe 63. Where conductor 60' is poly silicon, it oxidizes more rapidly than single crystal semiconductor exposed in void cavity 70. Oxide region 73 forms on top of conductor 60 and oxide 74 forms in fissure or pipe 63 by oxide regions 65' increasing in thickness until they meet along central axis 75 in the center of fissure or pipe 63, thereby closing fissure or pipe 63. Closure will tend to occur first near the top of fissure or pipe 63 where the oxygen concentration is greater than in the lower regions of fissure or pipe 63 or cavity 70. Oxide 56 on the bottom of conductor 60' may thicken somewhat and thin oxide layer 71 will likely form on the inner surface of cavity 70. Nevertheless, the main volume of cavity 70 will remain oxide free and empty (void) since fissure or pipe 63 will seal before cavity 70 can fill with oxide. Structure 307 results wherein substantially void cavity 70 underlies conductor 60' and fissure or pipe 63 is sealed by oxide 74. Structure 307 results.

Figure 9:
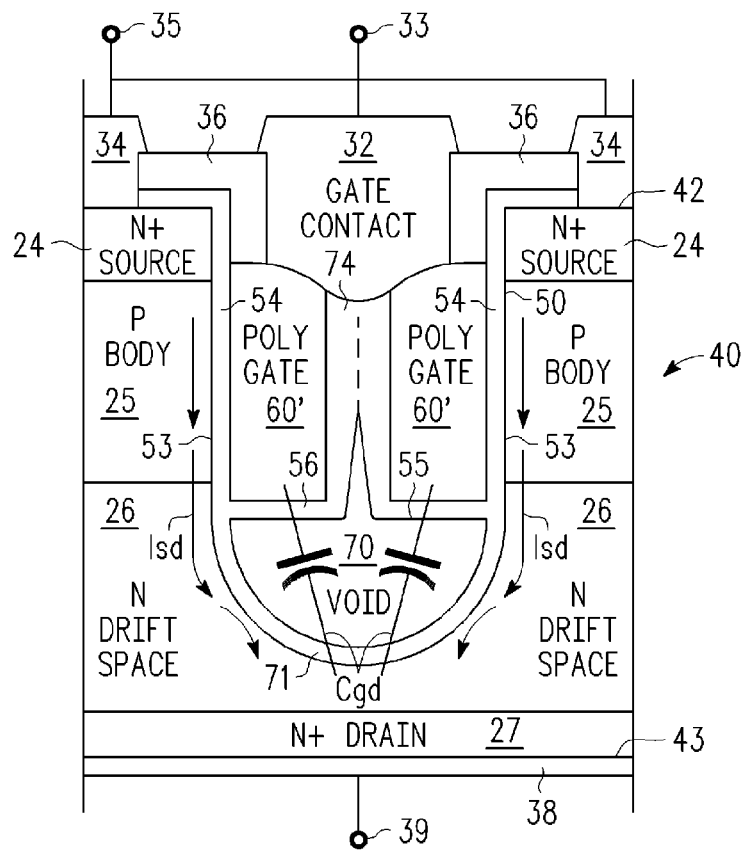

Referring now to manufacturing stage 208 of FIG. 9, finished device 80 represented by structure 308 is completed in substantially the same manner as for device 20 of FIG. 1. That is, N+ source region 24 is provided adjacent surface 42 and typically laterally around cavity 50 and with source contact 34 and terminal 35. P BODY region 25 is provided beneath source region 24, also typically laterally around cavity 50 in contact with gate dielectric 54 on sidewall 53 of cavity 50. POLY GATE 60' lies centrally within cavity 50 separated from P BODY 25 by gate dielectric 54 and has gate contact 32 with terminal 33 in ohmic contact with POLY GATE 60'. N DRIFT SPACE 26 is provided beneath P BODY 25 and generally laterally surrounding cavity 70, insulated from POLY GATE 60' by a portion of gate dielectric 54. N+ drain 27 with drain contact 38 and drain terminal 39 is provided adjacent bottom surface 43 of SC body 40, and coupled with N DRIFT SPACE 26. Because void cavity 70 is substantially empty of solid or liquid material, at most having low pressure gas left over from the sealing of fissure or pipe 63, it has a much lower average dielectric constant k and therefore lower Cgd than prior art device 20 of FIG. 1.

Figure 10:
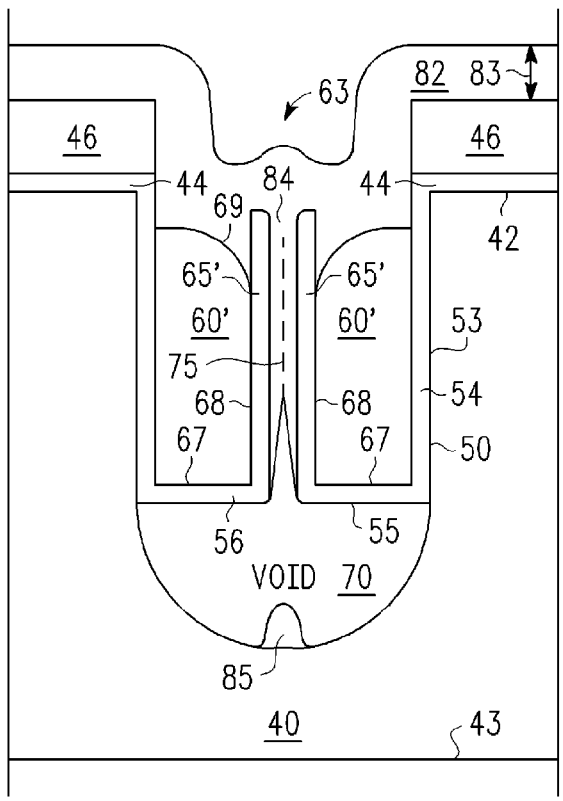
FIGS. 10-12 are simplified schematic cross-sectional views of a generalized vertical semiconductor device according to further embodiments of the present invention, at various stages of manufacture.
Figure 11:
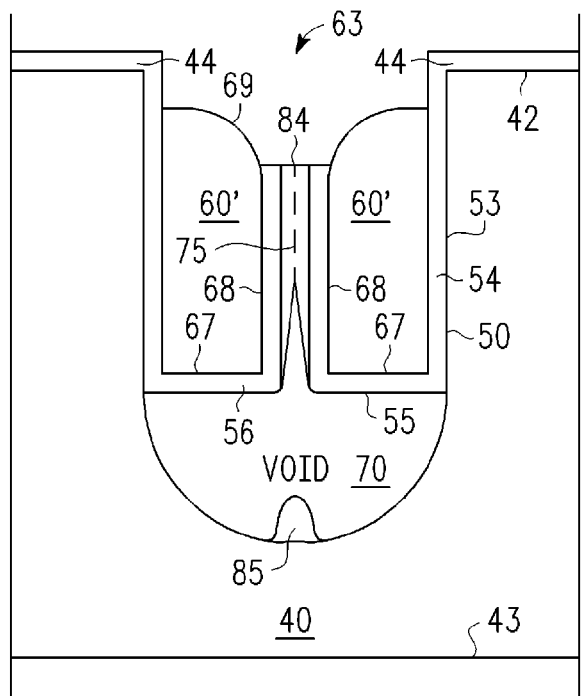
Figure 12:
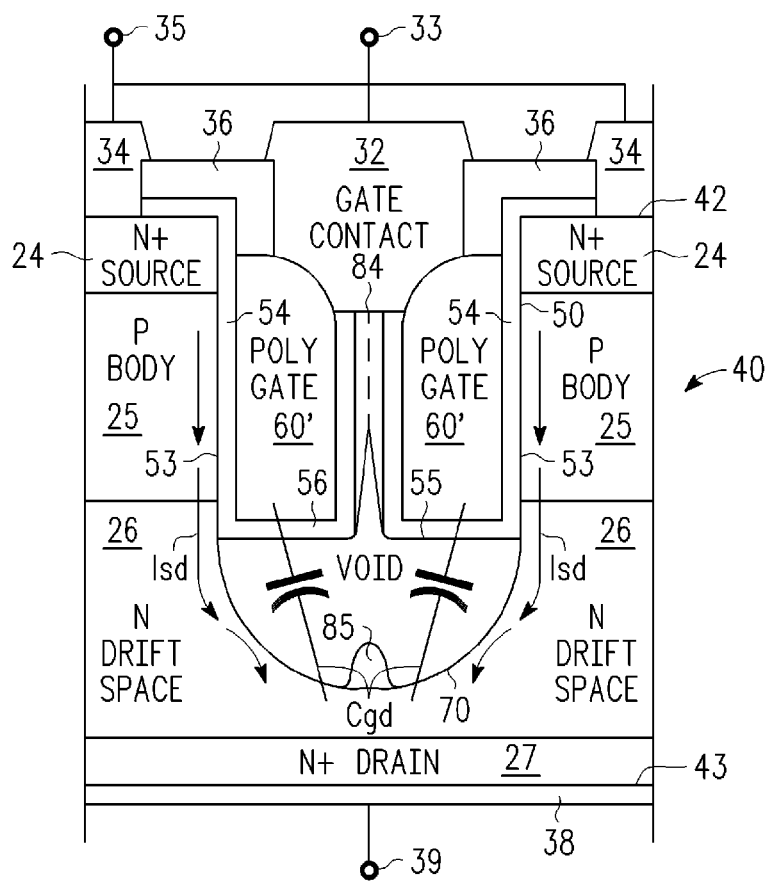

FIGS. 10-12 are simplified schematic cross-sectional views of a generalized vertical semiconductor device according to further embodiments of the present invention, at various stages of manufacture. In these embodiments, preliminary manufacturing stages 201 through 206 of FIGS. 2-7 are followed by manufacturing stage 209 of FIG. 10. In manufacturing stage 209 of FIG. 10, conformal dielectric layer 82 (e.g., silicon oxide) of thickness 83 is formed or deposited over structure 306 of FIG. 7 so that fissure or pipe 63 is sealed by dielectric 84. Chemical vapor deposition (CVD) or plasma enhanced CVD, evaporation and sputtering are non-limiting examples of suitable methods for applying dielectric layer 82. Because deposition will occur at a somewhat greater rate near the upper end of fissure or pipe 63 as opposed to the lower end or in void cavity 70, dielectric 84 (e.g., silicon oxide) will seal the upper end of fissure or pipe 63 before the lower end. A small amount 85 of dielectric 82 may accumulate directly under fissure or pipe 63 on the lower surface of void cavity 70 before fissure or pipe 63 seals. Nonetheless, the principal part of cavity 70 will remain free of dielectric material, i.e., a void. Structure 309 results.

In manufacturing stage 210 of FIG. 11, anisotropic etching is preferentially used (although isotropic etching is also useful) to remove the portion of layer 82 that overlies upper surface 69 of conductor 60', thereby exposing surface 69 of conductor 60' and leaving in place dielectric plug 84 in fissure or pipe 63. Etch mask 46 is also desirably removed. Structure 310 results. Referring now to manufacturing stage 211 of FIG. 12, finished device 82 represented by structure 309 is completed in substantially the same manner as for device 20 of FIG. 1. That is, N+ source region 24 is provided adjacent surface 42 with source contact 34 and terminal 35, P BODY region 25 is provided beneath source region 24 in contact with gate dielectric 54 on sidewalls 53 of cavity 50, POLY GATE 60' lies centrally within cavity 50 separated from P BODY 25 by gate dielectric 54 and has gate contact 32 with terminal 33 in ohmic contact with POLY GATE 60', N DRIFT SPACE 26 is provided beneath P BODY 25 and surrounding cavity 70 insulated from POLY GATE 60' by a portion of gate dielectric 54, and N+ drain 27 with drain contact 38 and drain terminal 39 is provided adjacent bottom surface 43 of SC substrate 40. Because void cavity 70 is substantially empty of solid or liquid material, at most having low pressure gas left over from the sealing of fissure or pipe 63 by dielectric plug 84, it has a much lower average dielectric constant k and therefore lower Cgd than prior art device 20 of FIG. 1.

Figure 2:
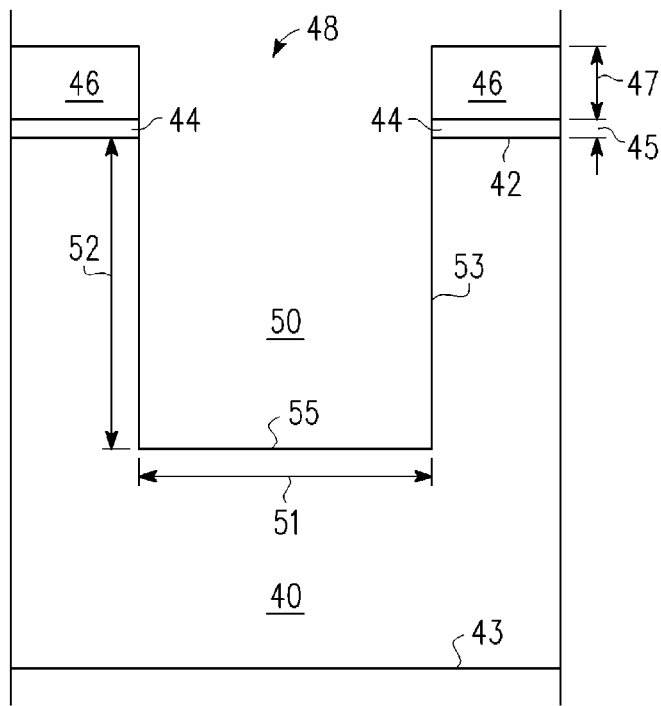
FIGS. 2-9 are simplified schematic cross-sectional views of a generalized vertical semiconductor device according to embodiments of the present invention, at various stages of manufacture.
Figure 13:
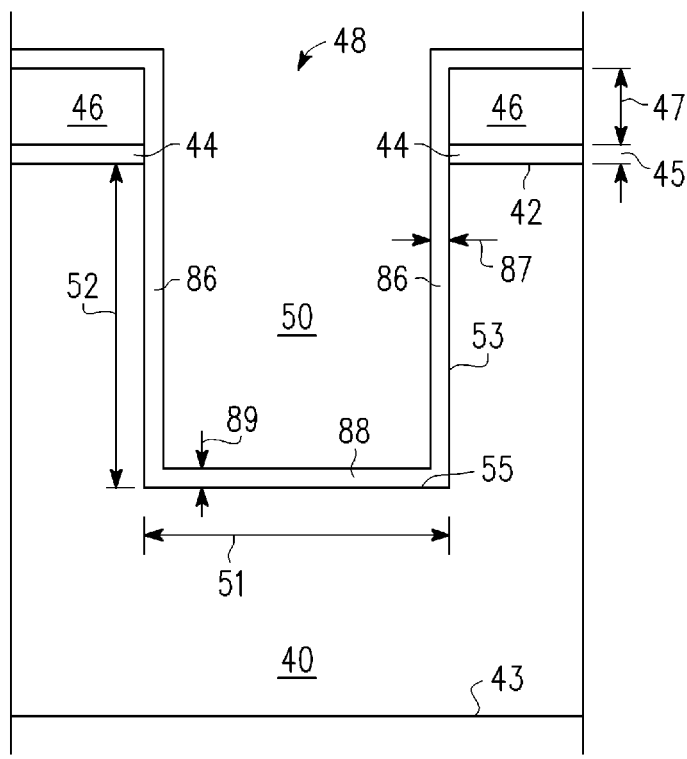
FIGS. 13-22 are simplified schematic cross-sectional views of a generalized vertical semiconductor device according to still further embodiments of the present invention, at various stages of manufacture.
Figure 14:
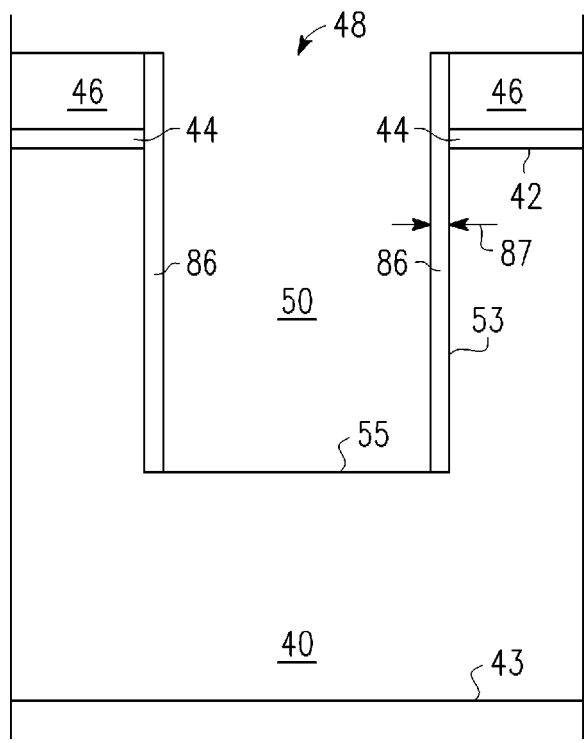

FIGS. 13-22 are simplified schematic cross-sectional views of a generalized vertical semiconductor device according to still further embodiments of the present invention, at various stages of manufacture. In these embodiments, preliminary manufacturing stage 201 of FIG. 2 is followed by manufacturing stage 212 of FIG. 13. Referring now to manufacturing stage 212 of FIG. 13, structure 301 of FIG. 2 has dielectric layer 86 of thickness 87 formed on sidewall 53 of cavity 50 and dielectric layer 88 of thickness 89 formed on bottom 55 of cavity 50. Thicknesses 87, 89 are generally similar to thicknesses 56, 57 of FIG. 5 and the discussion thereof is incorporated herein by reference. In the example of FIG. 13, a conformal deposited dielectric layer 86, 88 of differentially etchable material adapted to prevent oxidation of semiconductor 40 is illustrated. Dielectric layer 86, 88 is conveniently of silicon nitride and may be formed by chemical vapor deposition (CVD) or other well known techniques. Silicon nitride is an example of a suitable material for layer 86, 88 but this is merely for convenience of explanation and not intended to be limiting. Structure 312 results. In manufacturing stage 213 of FIG. 14, portion 88 of dielectric layer 86, 88 on bottom 55 of cavity 50 is removed, conveniently by anisotropic etching, as for example, by a plasma etch, but other anisotropic etching techniques may also be used. Structure 313 results.

Figure 15:
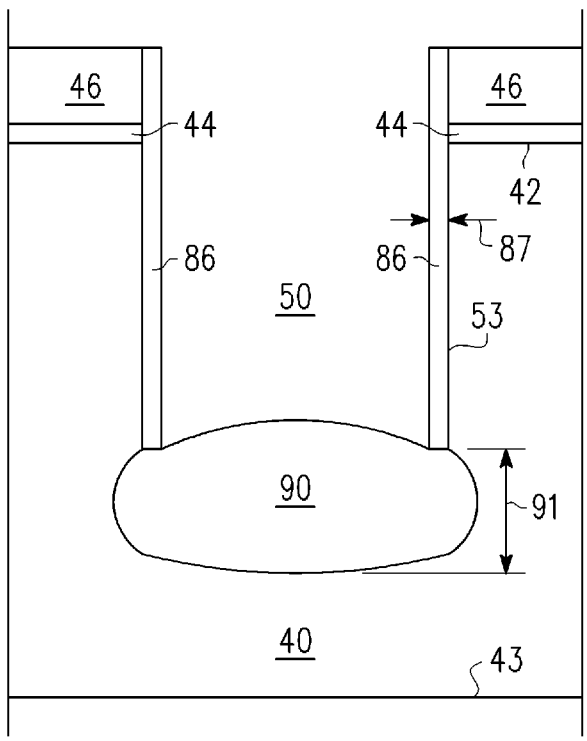
Figure 16:
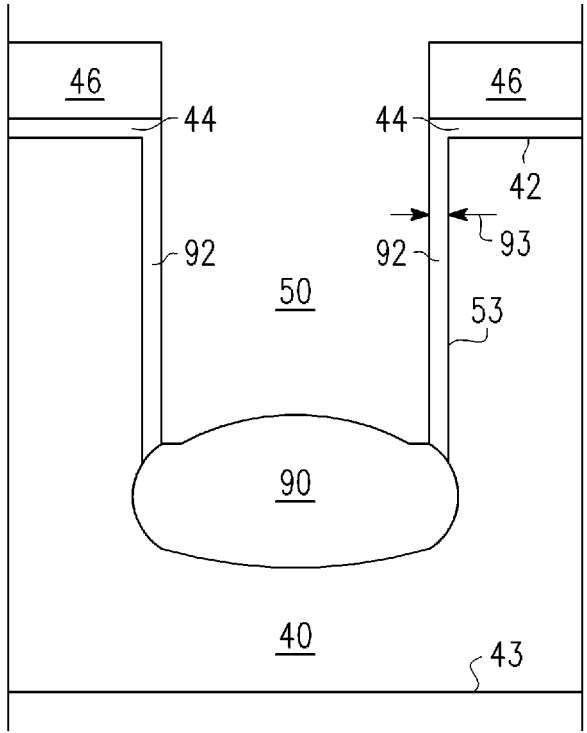

In manufacturing stage 214 of FIG. 15, bottom 55 of cavity 50 is oxidized (thermally or anodically) to form oxide region 90 having thickness 91. Steam or wet oxidation is an example of a suitable rapid oxidation technique for forming oxide region 90. Oxide region 90 will be subsequently removed to form an enclosed cavity; hence thickness 91 corresponds approximately to the vertical extent of the enclosed cavity and is usefully in the range of about 0.05 to 2 micrometers, more conveniently about in the range of 0.1 to 1 micrometers, and preferably about 0.2 to 0.5 micrometers. Oxide region 90 is shown in the example of FIG. 15 and following as being slightly larger laterally than cavity 50, but this is not intended to be limiting, and oxide region 90 may have a lateral extent that is larger, smaller or about the same as the diameter or lateral extent of cavity 50 including oxidation resistant (e.g., nitride) sidewall layer 86. Structure 314 results. In manufacturing stage 215 of FIG. 16, sidewall nitride layer 86 of structure 314 is removed, for example, using wet or isotropic plasma etching, and dielectric layer 92 of thickness 93 formed on sidewalls 53 of cavity 50. Dielectric layer 92 is analogous to dielectric layer 54 of thickness 57 of FIG. 5 and like dielectric layer 54 can conveniently form the gate dielectric of the completed transistor. The discussion of layer 54 and thickness 57 of FIG. 5 is incorporated herein by reference as applying to layer 92 and thickness 93. Gate dielectric thickness and other properties are chosen depending upon the desired properties (e.g., gain, threshold voltage, gate breakdown voltage, etc.) of the resulting device. Alternatively, dielectric (e.g., oxide) layer 92 may be formed on sidewall 53 of cavity 50 prior to manufacturing stage 212 so that it underlies dielectric layer (e.g., nitride) layer 86 in FIG. 13. Then, when layer 86 is stripped in manufacturing stage 215 it is already present and need not be grown or formed in manufacturing stage 215. Structure 315 results from either approach.

Figure 17:
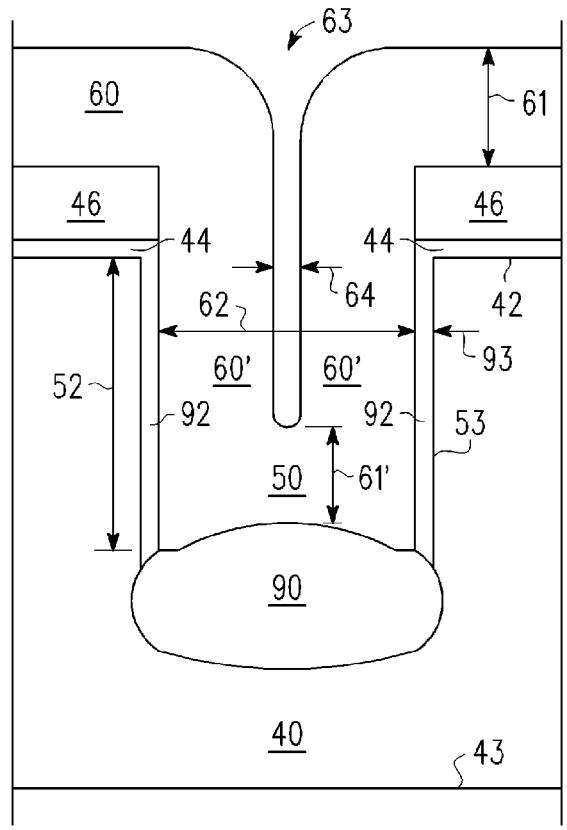
Figure 18:
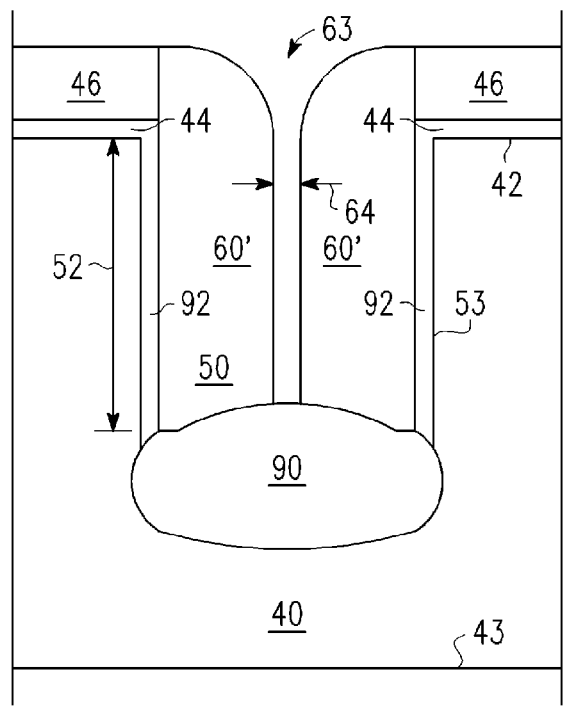
Figure 19:
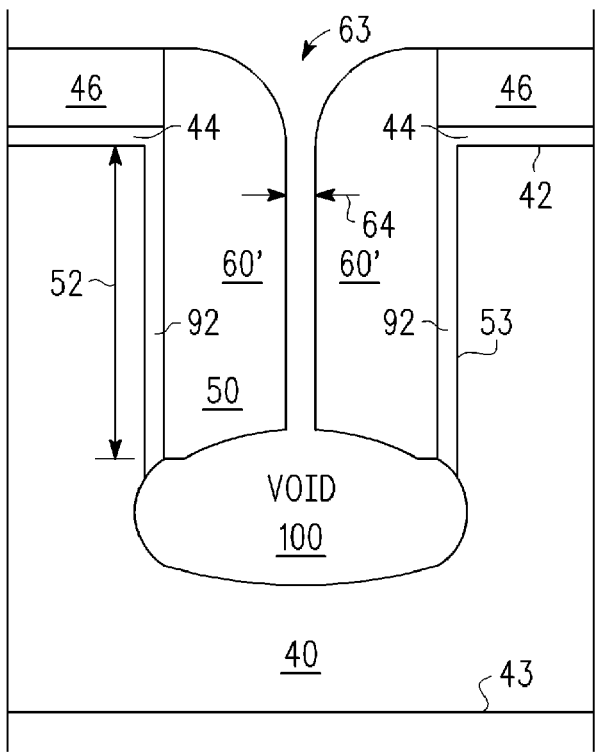
Figure 20:
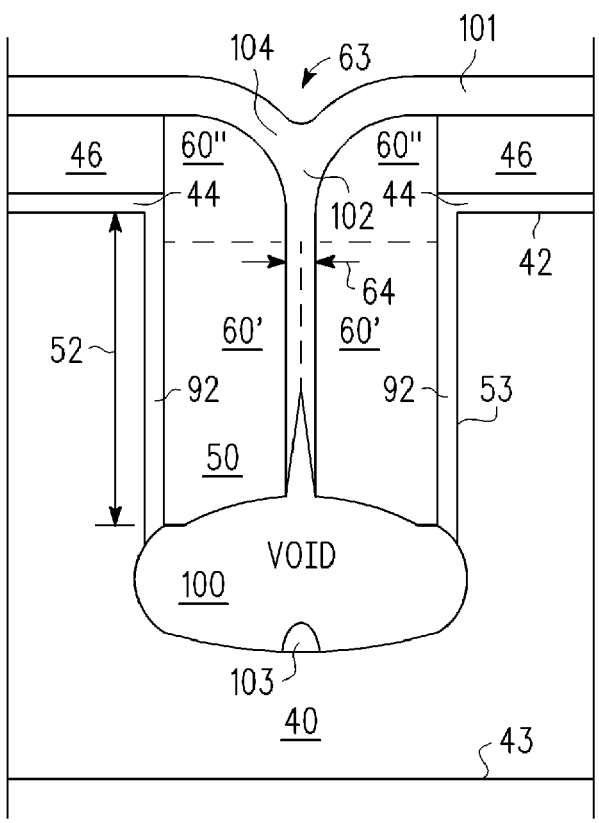

Referring now to manufacturing stage 216 of FIG. 17, conformal layer 60 such as is described in connection with FIG. 3 is formed by blanket conformal deposition above etch mask 46 and in cavity 50 to thickness 61 that is desirably less than half of width 62 between dielectric layer 92 on sides 53 of cavity 50, so as to leave central fissure or empty pipe 63 of width 64 in portions 60' of layer 60 within cavity 50. Fissure or pipe 63 will extend to distance 61' from oxide region 90 beneath cavity 50. Distance 61' is typically about equal to thickness 61. The magnitudes of dimensions 61, 62, 64, 61' presented in connection with the discussion of manufacturing stage 202 of FIG. 3 and elsewhere are incorporated herein by reference. Structure 316 results. In manufacturing stage 217 of FIG. 18, excess conductor material above portion 60' is removed in the same manner as used in manufacturing stage 203 of FIG. 4, so as to extend open fissure or pipe 63 to oxide region 90. Structure 317 results. In manufacturing stage 218 of FIG. 19, open fissure or pipe 63 is used to remove buried dielectric (e.g., silicon oxide) region 90, thereby producing buried void cavity 100 underlying conductor region 60'. Isotropic wet etching is suitable for removing oxide region 90. Structure 318 results. Once oxide region 90 is removed, void cavity 100 may be deepened by anisotropic etching of semiconductor substrate 40. However, unless separately masked, some of the upper portion of conductor 60' may be consumed in such an anisotropic etch. In manufacturing stage 219 of FIG. 20, dielectric plug 102 is created in open fissure or pipe 63, by any of the techniques already described, as for example and not intended to be limiting, thermal or anodic oxidation as used in manufacturing stage 207 of FIG. 8 or dielectric deposition as used in manufacturing stage 209 of FIG. 10. Either arrangement is useful. For convenience of explanation and not intended to be limiting, it is assumed in manufacturing stage 219 of FIG. 20 that dielectric plug 102 in fissure or pipe 63 is provided by depositing conformal dielectric layer 101 over etch mask 46, conductor 60' and into fissure or pipe 63, as has been previously described. As in FIG. 10, a small amount 103 of dielectric layer 101 may deposit in the bottom of void cavity 100 before the upper portion of fissure or pipe 63 is sealed off by dielectric plug 102. Silicon oxide is a non-limiting example of a suitable material for layer 101 and plug 102. Structure 319 results.

Figure 21:
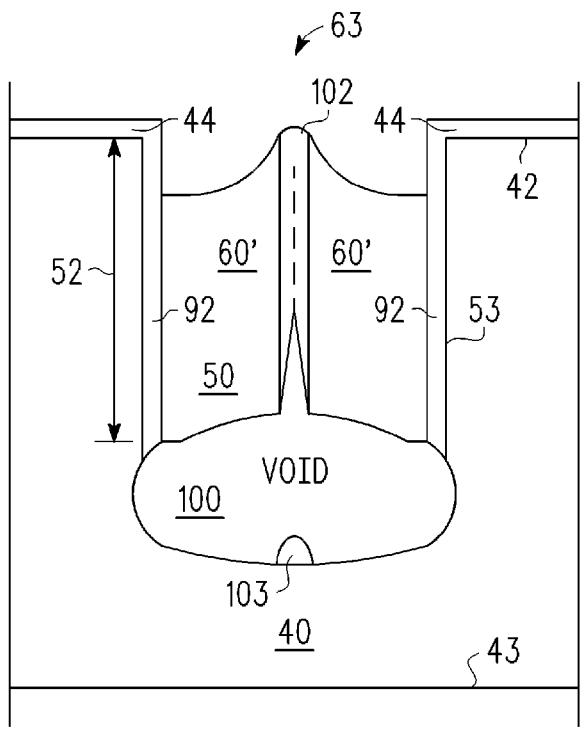

Referring now to manufacturing stage 220 of FIG. 21, structure 319 is etched (see FIGS. 20-21 together) to remove top portion 104 of dielectric layer 101 and upper portions 60" of conductor 60, leaving conductor portions 60' in cavity 50 and dielectric plug 102 sealing fissure or pipe 63 above void cavity 100. Etch mask 46 is also desirably removed. Structure 320 results. Referring now to manufacturing stage 221 of FIG. 22, finished device 84 represented by structure 321 is completed in substantially the same manner as for device 80 of FIG. 9. N+ source region 24 is provided adjacent surface 42 with source contact 34 and terminal 35. P BODY region 25 is provided beneath source region 24 in contact with gate dielectric 92 on sidewalls 53 of cavity 50. POLY GATE 60' lies centrally within cavity 50 separated from P BODY 25 by gate dielectric 92 and has gate contact 32 with terminal 33 in ohmic contact with POLY GATE 60'. N DRIFT SPACE 26 is provided beneath P BODY 25 and generally laterally surrounding void cavity 100 and is insulated from POLY GATE 60' by a portion of gate dielectric 92. N+ drain 27 with drain contact 38 and drain terminal 39 is provided adjacent bottom surface 43 of SC body 40 and electrically coupled to N DRIFT SPACE 26. Because void cavity 100 is substantially empty of solid or liquid material, at most having low pressure gas left over from the sealing of fissure or pipe 63 by dielectric plug 102, it has a much lower average dielectric constant k and therefore lower Cgd than prior art device 20 of FIG. 1.

Figure 22:
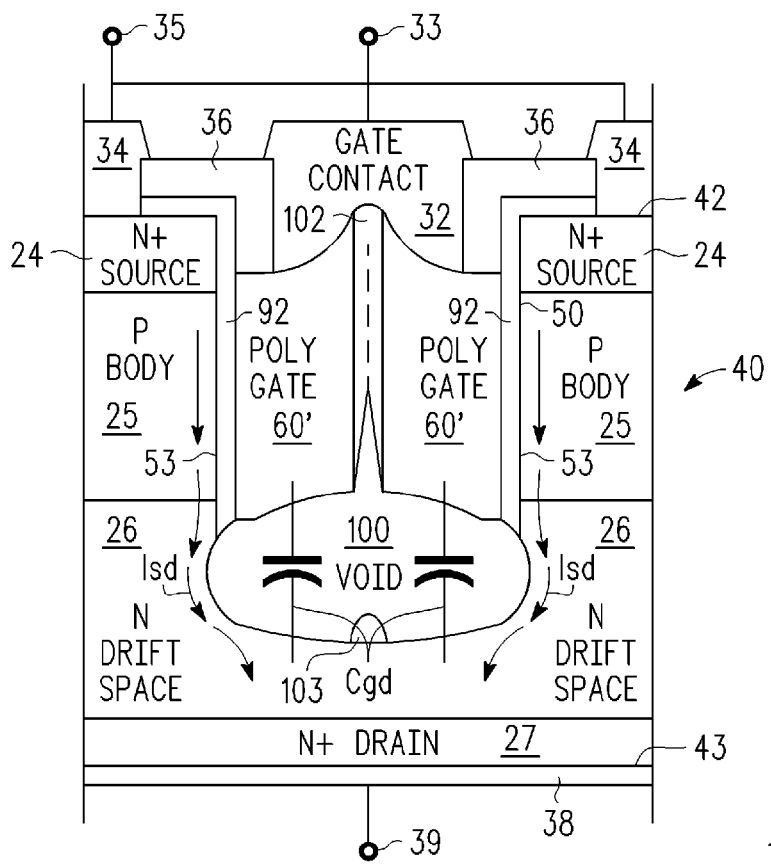
Figure 23:
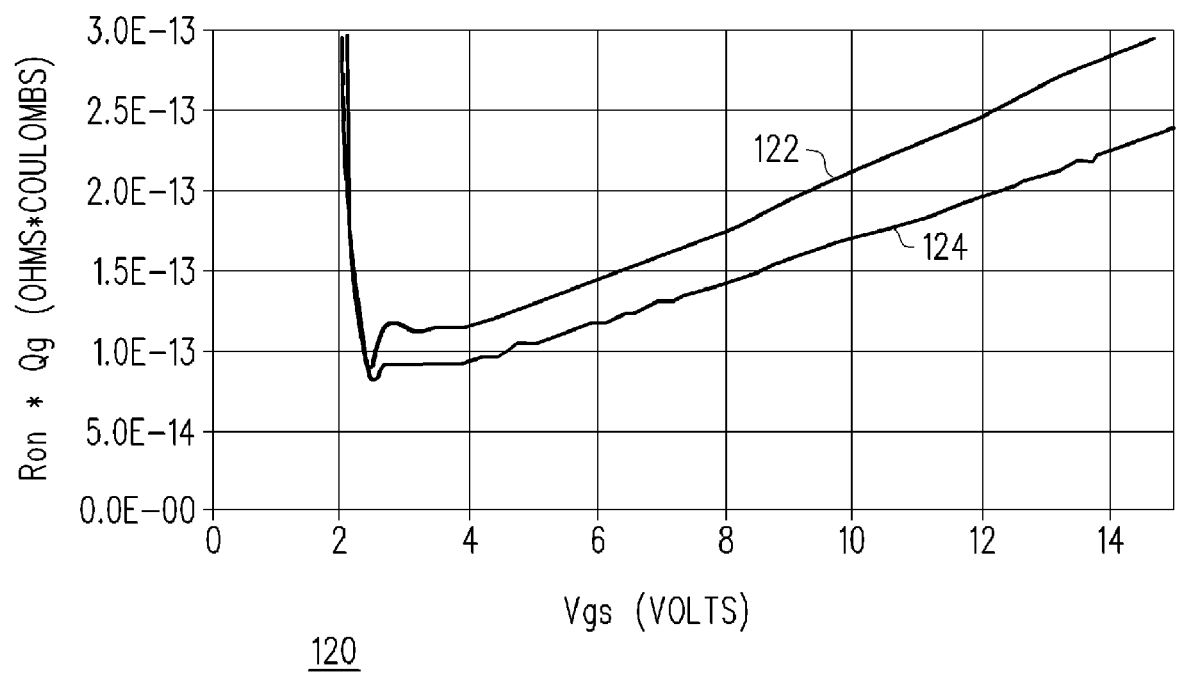
FIGS. 23 is a plot of a figure of merit Ron*Qg, where Ron is the series ON-resistance in Ohms and Qg is the gate charge in Coulombs, as a function of gate-source voltage Vgs, comparing a FET without a void cavity such as the device of FIG. 1, to a FET with a void cavity such as, for example, the device of FIG. 22.

FIG. 23 shows plot 120 of figure of merit Ron*Qg, where Ron is the series source-drain ON-resistance in Ohms and Qg is the gate charge in Coulombs, as a function of gate-source voltage Vgs, comparing a FET without a void cavity in trace 122, such as the device of FIG. 1, to a FET with a void cavity in trace 124, such as the device of FIG. 22. These results were obtained by computer simulation. Other than the absence or presence of a void cavity (e.g., void cavity 100) underlying gate conductor 60', substantially similar device geometries and dimensions were used for the simulation. The gate charge Qg depends on the gate capacitance Cgd. Other things being equal, the lower the gate-drain capacitance Cgd, the lower the gate charge Qg. The product Ron*Qg is a useful figure of merit since it expresses the RC time constant of the output stage of the device. The lower Ron*Qg, the lower the output RC time constant, and the faster the device can operate. By comparing trace 122 (no void cavity) and trace 124 (with a void cavity) it can be seen that providing the void cavity beneath the gate conductor improves the figure of merit Ron*Qg for all useful gate voltages and therefore the overall device performance. Since Cgd is reduced, the capacitive coupling between gate and drain is also reduced further improving device performance by reducing the undesirable drain-gate feedback through Cgd. In the simulation, the relative dielectric constant (permittivity) k of the void cavity was taken as equal to that of empty space since that closely approximates the situation within void cavity 100 (or any of the other void cavities described herein). If it was assumed that the cavity was filled with a solid dielectric, e.g., dielectric 39 of FIG. 1, the figure of merit Ron*Qg would be proportionately higher because the permittivity k of a solid dielectric is always greater than the permittivity of empty space. Thus, the present invention provides performance that is better than what can be obtained even with low permittivity (low k) dielectrics regions such as region 39 of FIG. 1. This is a significant improvement.

According to a first embodiment, there is provided a method (201-209; 201-207, 210-211) for forming a semiconductor device (80, 82) employing a void cavity (70, 100), comprising, providing a semiconductor substrate (40), forming (201) a first cavity (50) in the semiconductor substrate (40), wherein the first cavity (50) has a sidewall (53) and a bottom (55), providing (202, 215) a dielectric liner (54) on the sidewall (53) of the first cavity (50), forming (202-206) a conductor (60') in the first cavity (50) within the dielectric liner (54), wherein the conductor (60') has a fissure (63) therein extending to the substrate (40) beneath the first cavity (50), forming (206) a void cavity (70, 100) in the semiconductor substrate (40) beneath the conductor (60'), and plugging the fissure (207, 209) while leaving the void cavity (70, 100) substantially empty. According to a further embodiment, the dielectric liner (54) is of a material that is substantially resistant to the step (206) of forming the void cavity (70, 100) in the semiconductor substrate (40). According to a still further embodiment, the step (202) of providing a dielectric liner (54) comprises, providing a dielectric liner (54, 56) on the sidewall (53) and the bottom (55) of the first cavity (50), and wherein the step (202-206) of forming the conductor (60') comprises, depositing (202) a conductor (60) in the first cavity (50) with a fissure (63) therein extending part way to the substrate (40) beneath the first cavity (50), and etching (203, 204) the conductor (60') in the first cavity (50) to extend the fissure (63) to a portion (561) of the dielectric liner (56) on the bottom (55) of the first cavity (50). According to a yet further embodiment, the method further comprises between the steps (202-205) of forming the conductor (60') in the first cavity (50) and forming (206) a void cavity (70, 100) in the substrate (40), lining (204-205) a sidewall of the fissure (63) with a further material (65) substantially resistant to the step (206) of forming the void cavity (70, 100). According to a yet still further embodiment, the method further comprises, before forming (206) the void cavity (70, 100) in the substrate (40), removing the portion (561) of the dielectric liner (56) on the bottom (55) of the first cavity (50) underlying the fissure (63) so as to expose a portion (55') of the substrate (40) beneath the fissure (63). According to a still yet further embodiment, the step (205) of removing the portion (561) of the dielectric liner (56) on the bottom wall (55) of the first cavity (50) underlying the fissure (63) comprises anisotropically etching (205) the portion (561) of the dielectric liner (56) on the bottom (55) of the first cavity (50) without significantly etching the further material (65') lining a sidewall the fissure (63). According to another embodiment, the step (206) of forming a void cavity (70, 100) in the substrate (40) comprises, etching the void cavity (70, 100) in the substrate (40) through the fissure (63) in the conductor (60').

According to a second embodiment, there is provided a method (201, 212-221) for providing a void cavity (100) in a semiconductor device (84), comprising, providing (201) a semiconductor substrate (40), forming (201, 212) a first cavity (50) having a sidewall (53) and a floor (55) in the semiconductor substrate (40), replacing (213-214) a region of the substrate (40) beneath the floor (55) of the first cavity (50) with a first material (90) differentially etchable with respect to the substrate (40), providing (215) a dielectric liner (92) on the sidewall (53) of the first cavity (50), forming (216-217) in the first cavity (50) within the dielectric liner (92) a second material (60') that is not substantially etched by reagents that etch the first material (90), wherein the second material (60') has a fissure (63) extending there through to the first material (90), using the fissure (63), forming (218) a void cavity (100) in the substrate (40) by etching away the first material (90), and closing (219) the fissure (63) without substantially filling the void cavity (100). According to a further embodiment, the method further comprises prior to the replacing step (214), lining (212-213) the sidewall (53) of the first cavity (50) with a third material (86) substantially impervious to the replacing (214) step so as to protect the sidewall (53) of the first cavity (50) during the replacing step (214). According to a still further embodiment, the step (212-213) of lining the sidewall (53) of the first cavity (50) comprises, coating (212) the sidewall (53) and floor (55) of the first cavity (50) with the third material (86) substantially impervious to the replacing step (214) and then anisotropically removing (213) the third material (86) from the floor (55) of the first cavity (50). According to a yet further embodiment, the step (215) of providing a dielectric liner (92) on the sidewall (53) of the first cavity (50) comprises, (i) first removing (214-215) the third material (86) from the sidewall (53) of the first cavity (50) and then providing (215) the dielectric liner (92) on the sidewall (53) of the first cavity (50), or (ii) providing the dielectric liner (54, 92) on the sidewall (53) of the first cavity (50) before providing the third material (86) and then re-exposing the dielectric liner (54, 92) by removing the third material (86) after the replacing step (214). According to a still yet further embodiment, the step (216-218) of forming the second material (60') comprises, depositing (216) the second material (60, 60') in the first cavity (50) on the first material (90) so that the second material (60, 60') has a fissure (63) extending part way to the first material (90) and then etching (216-217) the second material (60') beneath the fissure (63) to extend the fissure (63) to the first material (90). According to a yet still further embodiment, the substrate (40) comprises silicon, the first material (90) comprises silicon oxide, the second material (60') comprises poly-silicon, the third material (86) comprises silicon nitride and the dielectric liner (92) comprises silicon oxide.

According to a third embodiment, there is provided a semiconductor device (80, 82, 84), comprising, a semiconductor substrate (40), a first cavity (50) formed in the substrate (40), the first cavity (50) having a sidewall (53) and a bottom (55), a dielectric (54, 92) lining the sidewall of the first cavity, adapted to act as a gate insulator, a gate conductor (60') within the cavity (50) extending to the gate insulator (64, 92), a body region (25) of a first conductivity type located in the semiconductor substrate (40) laterally outside the gate insulator (52, 92), a source region (24) of a second, opposite conductivity type, in the substrate (40) proximate an upper portion (42) of the first cavity (50) and the body region (25), adapted to inject carriers into the body region (25) in response to a bias applied to the gate conductor (60'), a drain region (27) of the second conductivity type in the substrate (40), coupled to the body region (25) and adapted to collect carriers from the body region (25) in response to a bias applied to the drain region (27), and a void cavity (70, 100) in the substrate (40) proximate the bottom (55) of the first cavity (50), located between the drain region (27) and the gate conductor (60'). According to a further embodiment, the drain region (27) is coupled to the body region (25) by a drift space (26) of the second conductivity type. According to a still further embodiment, the void cavity (70, 100) is located at least partially within the drift space (26) between the gate conductor (60') and the drain region (27). According to a yet further embodiment, the device is made by a process comprising, forming the void cavity (70, 100) by etching a space within the substrate (40)

beneath the first cavity (50). According to a still yet further embodiment, the device is made by a process comprising, forming the void cavity (100) by removing a dielectric region (90) formed in the substrate (40) beneath the first cavity (50). According to a yet still further embodiment, the device is made by a process comprising, forming the void cavity (70, 100) by differential etching through a fissure (63) in the gate conductor (60') using reagents that attack the substrate (40) beneath the first cavity (50) but do not substantially attack material (65') on a sidewall of the fissure (63). According to another embodiment, the device is made by a process comprising, forming the void cavity (70, 100) by etching through a fissure (63) in the gate conductor (60') that extends through the gate conductor (60') to the bottom (55) of the first cavity (50).

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for forming a semiconductor device employing a void cavity, comprising:
    providing a semiconductor substrate;
    forming a first cavity in the semiconductor substrate, wherein the first cavity has a sidewall and a bottom;
    providing a dielectric liner on the sidewall of the first cavity;
    forming a conductor in the first cavity within the dielectric liner, wherein the conductor has a fissure therein extending to the substrate beneath the first cavity;
    forming a void cavity in the semiconductor substrate beneath the conductor by etching the substrate through the fissure in the conductor to remove a portion of the substrate corresponding to the void cavity; and
    plugging the fissure while leaving the etched void cavity substantially empty.

2. The method of claim 1, wherein the dielectric liner is of a material that is substantially resistant to the step of forming the void cavity in the semiconductor substrate.

3. The method of claim 1, wherein the step of providing a dielectric liner comprises, providing a dielectric liner on the sidewall and the bottom of the first cavity; and
    wherein the step of forming the conductor, comprises:
        depositing a conductor in the first cavity with a fissure therein extending part way to the substrate beneath the first cavity; and
        etching the conductor in the first cavity to extend the fissure to a portion of the dielectric liner on the bottom of the first cavity.

4. The method of claim 3, further comprising between the steps of forming the conductor in the first cavity and forming a void cavity in the substrate, lining a sidewall of the fissure with a further material substantially resistant to the step of forming the void cavity.

5. The method of claim 4, further comprising before forming the void cavity in the substrate, removing the portion of the dielectric liner on the bottom of the first cavity underlying the fissure so as to expose a portion of the substrate beneath the fissure.

6. The method of claim 5, wherein the step of removing the portion of the dielectric liner on the bottom wall of the first cavity underlying the fissure comprises anisotropically etching the portion of the dielectric liner on the bottom of the first cavity without significantly etching the further material lining a sidewall the fissure.

7. A method for providing a void cavity in a semiconductor device, comprising:
    providing a semiconductor substrate;
    forming a first cavity having a sidewall and a floor in the semiconductor substrate;
    replacing a region of the substrate beneath the floor of the first cavity with a first material differentially etchable with respect to the substrate;
    providing a dielectric liner on the sidewall of the first cavity;
    forming in the first cavity within the dielectric liner a second material that is not substantially etched by reagents that etch the first material, wherein the second material has a fissure extending there through to the first material;
    using the fissure, forming a void cavity in the substrate by etching away the first material; and
    closing the fissure without substantially filling the void cavity.

8. The method of claim 7, further comprising prior to the replacing step, lining the sidewall of the first cavity with a third material substantially impervious to the replacing step so as to protect the sidewall of the first cavity during the replacing step.

9. The method of claim 8, wherein the step of lining the sidewall of the first cavity comprises, coating the sidewall and floor of the first cavity with the third material substantially impervious to the replacing step and then anisotropically removing the third material from the floor of the first cavity.

10. The method of claim 9, wherein the step of providing a dielectric liner on the sidewall of the first cavity comprises, (i) first removing the third material from the sidewall of the first cavity and then providing the dielectric liner on the sidewall of the first cavity, or (ii) providing the dielectric liner on the sidewall of the first cavity before providing the third material and then re-exposing the dielectric liner by removing the third material after the replacing step.

11. The method of claim 10, wherein the step of forming the second material comprises, depositing the second material in the first cavity on the first material so that the second material has a fissure extending part way to the first material and then etching the second material beneath the fissure to extend the fissure to the first material.

12. The method of claim 11 wherein the substrate comprises silicon, the first material comprises silicon oxide, the second material comprises poly-silicon, the third material comprises silicon nitride and the dielectric liner comprises silicon oxide.

13. A method for forming a semiconductor device, the method comprising:
    providing a semiconductor substrate that includes a body region of a first conductivity type;
    forming a first cavity in the substrate, wherein the first cavity has a sidewall and a bottom;
    providing a dielectric lining in the sidewall of the first cavity, wherein the dielectric lining is adapted to act as a gate insulator;

forming a gate conductor within the cavity extending to the gate insulator, wherein the body region is located in the semiconductor substrate laterally outside the gate insulator;

forming a source region of a second, opposite conductivity type, in the substrate proximate an upper portion of the first cavity and the body region, wherein the source region is adapted to inject carriers into the body region in response to a bias applied to the gate conductor;

forming a drain region of the second conductivity type in the substrate, coupled to the body region and adapted to collect carriers from the body region in response to a bias applied to the drain region; and forming a void cavity in the substrate proximate the bottom of the first cavity by etching the substrate through a fissure in the gate conductor that extends through the gate conductor to the bottom of the first cavity to remove a portion of the substrate corresponding to the void cavity, wherein the void cavity is located between the drain region and the gate conductor.

14. The method of claim 13, wherein forming the drain region comprises forming the drain region to be coupled to the body region by a drift space of the second conductivity type.

15. The method of claim 14, wherein forming the void cavity comprises forming the void cavity to be located at least partially within the drift space between the gate conductor and the drain region.

16. The method of claim 13, wherein forming the void cavity comprises removing a dielectric region formed in the substrate beneath the first cavity.

17. A method for forming a semiconductor device, the method comprising:

providing a semiconductor substrate that includes a body region of a first conductivity type;

forming a first cavity in the substrate, wherein the first cavity has a sidewall and a bottom;

providing a dielectric lining in the sidewall of the first cavity, wherein the dielectric lining is adapted to act as a gate insulator;

forming a gate conductor within the cavity extending to the gate insulator, wherein the body region is located in the semiconductor substrate laterally outside the gate insulator;

forming a source region of a second, opposite conductivity type, in the substrate proximate an upper portion of the first cavity and the body region, wherein the source region is adapted to inject carriers into the body region in response to a bias applied to the gate conductor;

forming a drain region of the second conductivity type in the substrate, coupled to the body region and adapted to collect carriers from the body region in response to a bias applied to the drain region; and forming a void cavity in the substrate proximate the bottom of the first cavity, wherein the void cavity is located between the drain region and the gate conductor, wherein forming the void cavity comprises differentially etching through the fissure in the gate conductor using reagents that attack the substrate beneath the first cavity but do not substantially attack material on a sidewall of the fissure.

* * * * *